(12) United States Patent
Vuorio et al.

(10) Patent No.: US 6,591,090 B1
(45) Date of Patent: Jul. 8, 2003

(54) PREDISTORTION CONTROL FOR POWER REDUCTION

(75) Inventors: Juha Vuorio, Oulu (FI); Harri Lilja, Kimmontie (FI)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/317,386

(22) Filed: May 24, 1999

(30) Foreign Application Priority Data

May 27, 1998 (GB) .............................. 9811381

(51) Int. Cl.⁷ .......................... H01Q 11/12; H04K 1/02
(52) U.S. Cl. ..................... 455/126; 455/91; 330/151; 375/296; 375/297
(58) Field of Search ................ 455/126, 127, 455/115, 91, 522; 375/296, 297, 295; 330/151, 27 B, 149, 51

(56) References Cited

U.S. PATENT DOCUMENTS

| | | | |
|---|---|---|---|
| 4,291,277 A | * 9/1981 | Davis et al. ................ 330/149 |
| 4,878,030 A | * 10/1989 | Vincze ........................ 330/149 |
| 4,879,519 A | * 11/1989 | Myer ........................... 330/149 |
| 4,967,164 A | * 10/1990 | Sari ............................. 330/149 |
| 5,023,937 A | * 6/1991 | Opas ............................ 331/14 |
| 5,049,832 A | 9/1991 | Cavers ........................ 330/149 |
| 5,101,175 A | 3/1992 | Vaisanen ..................... 330/279 |
| 5,109,538 A | 4/1992 | Ikonen et al. ................. 455/89 |
| 5,118,965 A | 6/1992 | Vaisanen et al. ............. 307/261 |
| 5,152,004 A | 9/1992 | Vaisanen et al. .............. 455/68 |
| 5,164,884 A | 11/1992 | Pesola ......................... 361/386 |
| 5,204,643 A | 4/1993 | Verronen ..................... 333/81 R |
| 5,214,309 A | 5/1993 | Saarnimo .................... 257/712 |
| 5,214,372 A | 5/1993 | Vaisanen et al. .............. 324/95 |
| 5,230,091 A | 7/1993 | Vaisanen ...................... 455/88 |
| 5,241,694 A | 8/1993 | Vaisanen et al. ............ 455/126 |
| 5,276,917 A | 1/1994 | Vanhanen et al. ............ 455/89 |
| 5,291,147 A | 3/1994 | Muurinen .................... 330/136 |
| 5,392,464 A | 2/1995 | Pakonen ..................... 455/115 |
| 5,404,585 A | 4/1995 | Vimpari et al. ............. 455/115 |
| 5,432,473 A | 7/1995 | Mattila et al. .............. 330/133 |
| 5,434,537 A | 7/1995 | Kukkonen ...................... 330/2 |
| 5,450,620 A | 9/1995 | Vaisanen .................... 455/127 |
| 5,493,255 A | 2/1996 | Murtojarvi .................. 330/296 |
| 5,530,923 A | 6/1996 | Heinonen et al. ........... 455/126 |
| 5,548,616 A | 8/1996 | Mucke et al. ................ 375/295 |
| 5,564,074 A | 10/1996 | Juntti ........................ 455/67.1 |
| 5,675,611 A | 10/1997 | Lehtinen et al. ............ 375/297 |
| 5,697,074 A | 12/1997 | Makikallio et al. ......... 455/126 |

(List continued on next page.)

FOREIGN PATENT DOCUMENTS

WO    WO 97/28598    8/1997

OTHER PUBLICATIONS

Cavers, "Amplifier linearization using a digital predistortert with fast adaptation and low memory requirements", IEEE Transactions on Vehicular Technology, Nov. 1990, vol. 39 Issue 4, pp. 374–382.*

*Primary Examiner*—Charles N. Appiah
(74) *Attorney, Agent, or Firm*—Perman & Green, LLP

(57) ABSTRACT

There is provided a transmitter, and a method using such a transmitter, the transmitter having an amplifier for amplifying a received signal, predistortion means for predistorting a received signal prior to the signal passing through the amplifier means, a transmitter for transmitting a signal, and a control for controlling the transmitted. If the power level of the signal to be transmitted by the transmitter is below a predetermined level, the signal is not predistorteded by the predistortion means and if the power level of the signal to be transmitted by the transmitter is above a predetermined level the received signal passes through the predistortion means and amplifier.

27 Claims, 4 Drawing Sheets

U.S. PATENT DOCUMENTS

| | | | | |
|---|---|---|---|---|
| 5,732,333 A | * | 3/1998 | Cox et al. | 330/149 |
| 5,740,520 A | * | 4/1998 | Cyze et al. | 455/127 |
| 5,745,016 A | | 4/1998 | Salminen | 333/17.1 |
| 5,752,172 A | | 5/1998 | Matero | 455/127 |
| 5,786,728 A | | 7/1998 | Alinikula | 330/149 |
| 5,819,165 A | | 10/1998 | Hulkko et al. | 455/126 |
| 5,867,065 A | * | 2/1999 | Leyendecker | 455/126 |
| 5,884,149 A | | 3/1999 | Jaakola | 455/103 |
| 5,903,611 A | * | 5/1999 | Schnabl et al. | 375/297 |
| 5,937,011 A | * | 8/1999 | Carney et al. | 375/297 |
| 6,137,354 A | * | 10/2000 | Dacus et al. | 330/51 |
| 6,141,390 A | * | 10/2000 | Cova | 375/297 |
| 6,271,724 B1 | * | 8/2001 | Neffling | 330/149 |
| 6,288,606 B1 | * | 9/2001 | Ekman et al. | 455/126 |
| 6,304,140 B1 | * | 10/2001 | Thron et al. | 330/149 |
| 6,320,913 B1 | * | 11/2001 | Nakayama | 330/51 |

* cited by examiner

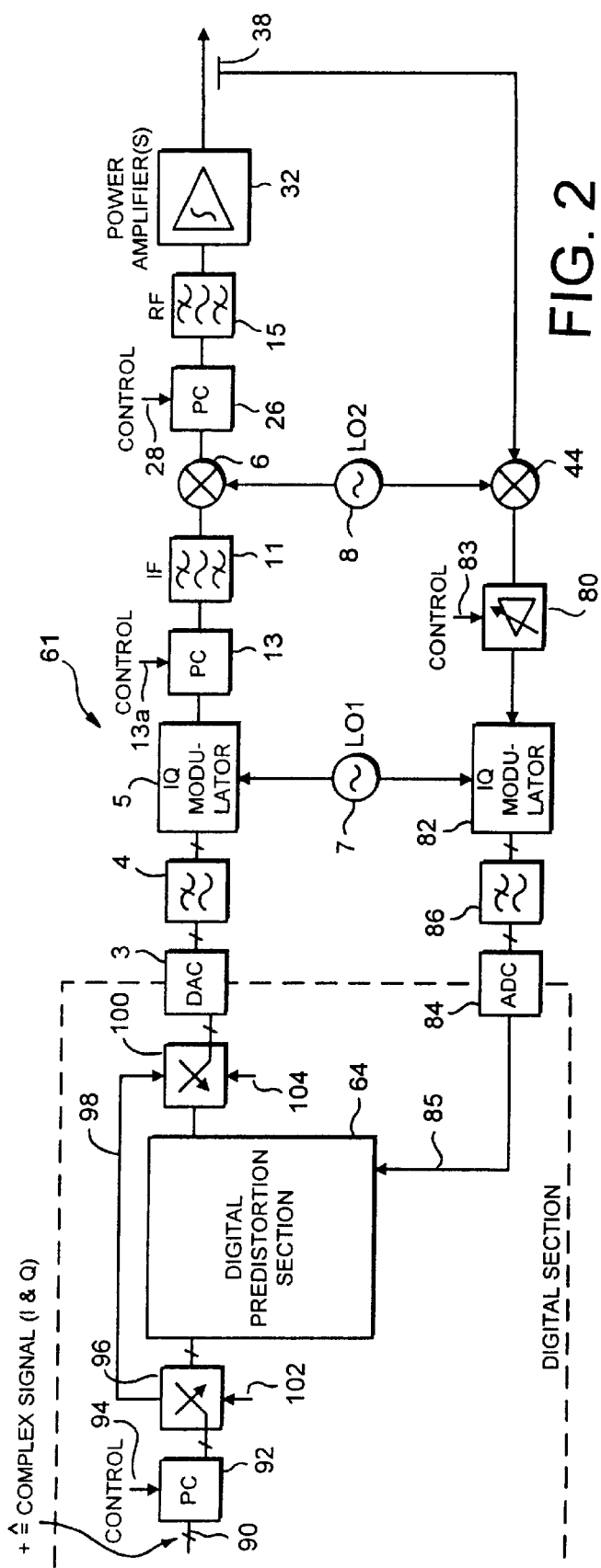

PREDISTORTION CONTROL FOR POWER REDUCTION

FIELD OF THE INVENTION

The present invention relates to a transmitter and a method for transmitting a signal. In particularly, but not exclusively, the present invention relates to a transmitter and a transmitting method for spread spectrum multiple access system using, for example code division multiple access (CDMA). The transmitter and method may be used in a cellular telecommunications network.

BACKGROUND TO THE INVENTION

The signal which is modulated prior to transmission is generally modulated using a digital modulation method. If the transmitter is not linear, spectrum spreading to adjacent channels can occur. This leads to a reduction in the system capacity. If the transmitter is linear or substantially linear, the problem of spectrum spreading to adjacent channels can be reduced. The linearity of the transmitter is largely dependent on the operating characteristics of the power amplifier. Highly linear power amplifiers could be used to reduce the amount of spectrum spreading to adjacent channels. However, the power efficiency of linear amplifiers is poor. Less linear amplifiers are more efficient and in particular consume less power for the required amplification.

It has therefore been proposed to use nonlinear amplifiers in spread spectrum transmitters but with compensation for the non-linearity of the amplifier. One method of compensation is digital predistortion. With this method, before a signal is input to a power amplifier, it is predistorted in a nonlinear manner. This predistortion is the inverse of the distortion which is applied by the amplifier. Accordingly, the predistorted signal is input to the amplifier which provides a linear output. However, whilst this method provides improved power consumption if the signal is to be transmitted with a relatively high power level, the power efficiency is lower when the signal is transmitted with a lower power level. This is because the predistortion part of the transmitter consumes the same amount of power regardless of the power level of the signal to be transmitted. Since CDMA mobile stations will tend to use lower power levels, there may be little power saving as compared to simply using a linear power amplifier.

Another problem in predistortion is related to power control. An adaptive predistorter, which is not capable of real time compensation of the non-linearity of the amplifier, requires a certain amount of time to adapt if the non-linearity is changed. In known transmitters, the power control uses adjustable analogue gain and/or attenuation. In practice, this means that the power is changed after predistortion and prior to amplification. Although the change in power level does not necessarily change the characteristics of the amplifier, it does change the non-linearity which is seen by the predistorter. This is because every output point of the predistorter corresponds to a certain input point of the amplifier, and an unexpected gain or attenuation occurring between the predistortion and the amplification causes a shifting of the signal so that those points do not correspond to each other anymore.

FIG. 1 shows such an arrangement which is known from U.S. Pat. No. 5,049,832. The transmitter 50 has a power amplifier 52 which operates in a non linear manner. The signal which is to be transmitted is input to an address calculator 54 which calculates an address from the input signal. The calculated address corresponds to a location in a look up table (LUT) 56. The values at the calculated address are output to a multiplier which predistorts the signal in accordance with these values. The transmitter also includes an adaption algorithm block which receives part of the signal to be transmitted. That signal is compared by the adaption algorithm block 60 with the signal which is input to the multiplier 62. The same signal which is input to the multiplier 62 is input to a delay block 58 which outputs that signal to the adaption algorithm block 60 after a predetermined delay. This ensures that the part of signal to be transmitted is compared by the adaption algorithm block 60 with the corresponding input signal. If the transmitted signal is not linear with respect to the input signal, the adaption algorithm block 60 calculates corrected values which are output to the LUT 56 and stored in the respective address. This arrangement suffers from the problem discussed hereinbefore, and especially it does not consider the problems associated with power control.

SUMMARY OF THE INVENTION

It is an aim of certain embodiments of the present invention to provide a transmitter including predistortion which is power efficient and which takes into account the problem associated with power control.

According to a first aspect of the present invention, there is provided a transmitter comprising: amplifier means for amplifying a received signal; predistortion means for predistorting a received signal prior to the signal passing through said amplifier means; transmitting means for transmitting a signal; and control means for controlling said transmitter, whereby if the power level of the signal to be transmitted by the transmitter means is below a predetermined level, the signal is not predistorted by said predistortion means and if the power level of the signal to be transmitted by the transmitter means is above a predetermined level said received signal passes through said predistortion means and said amplifier means.

Preferably, said predistortion means is arranged substantially to compensate for the non-linearity of said amplifier means, when used.

Thus, the predistortion means is only used when the power level of the transmitted signal is relatively high and the non-linearity of the amplifier means is most likely to cause problems. The predistortion means thus compensates for the nonlinear characteristics of the amplifier means. If the amplifier means are nonlinear, more efficient use of power can be achieved. However, when the power level falls below a predetermined level, the predistortion means are not used, which may allow the power required to operate the predistortion means to be saved. As the power level is much lower, any distortion at the output of the amplifier means may not cause significant problems in terms of interference with adjacent channels.

Preferably, when the power level of the signal is below the predetermined level, the predistortion means is switched off. This allows power to be saved.

A bypass path is preferably provided for bypassing said amplifier, whereby if a power level of a signal to be transmitted by the transmitting means is below a given level (which may be the same as the predetermined level), a received signal passes through the bypass path. Thus, the amplifier means may also be turned off in this situation.

Preferably, bias control means are provided for controlling the biassing applied to the amplifier means, whereby when the power level of the signal to be transmitted by the transmitting means is above the predetermined level, then the amplifier means is controlled by the bias control means to operate in a more power efficient class. In practice this means that the amplifier means may be less linear. This gets the maximum power efficiency out of the transmitter even allowing for the extra power consumption required by the predistortion means.

If the power level of the signal to be transmitted by said transmitter is below the predetermined level, the amplifier means are controlled by the bias control means to operate substantially linearly. Thus, the signal may pass through the amplifier which as it is controlled to operate in a linear fashion, gives a linear output.

The amplifier means may comprise a plurality of amplifiers arranged in series. The bypass path may bypass at least one of said plurality of amplifiers and the received signal may be arranged to pass through at least one amplifier, and in another mode of operation, a different number of amplifiers may be bypassed.

In this arrangement, a plurality of amplifiers are connected in series at least some of which are bypassed. For example, if three amplifiers are provided, in one mode of operation, one or two amplifiers could be bypassed whilst in another mode of operation all three amplifiers could be bypassed. This arrangement has the advantage that there is some flexibility in the gain applied to a signal. The number of amplifier stages which a signal passes through can thus be controlled.

The bias control means may be arranged to control the biassing of at least one of said amplifiers.

Preferably, a feedback path is provided for providing the predistortion means with a portion of the transmitted signal, said predistortion means being arranged to compare the portion of the transmitted signal with the signal received by the predistortion means. The predistortion means may be arranged to calculate at least one new predistortion value to be used by the predistortion means for a subsequent predistortion if the portion of the transmitted signal and the signal input to the predistortion means do not have a predetermined relationship. The predetermined relationship may be that the portion of the transmitted signal has a linear relationship with the signal input to the predistortion means.

Preferably, when the predistortion means is not used, the feedback path is switched off. This allows a further power saving to be achieved.

Gain control means may be provided for applying a gain to the signal prior to the signal being input to the predistortion means. At least one further gain control means may be provided between the output of the predistortion means and the amplifier means. Preferably, said first gain control means only is used to control the power level of the signal to be transmitted if predistortion is applied to the signal.

Preferably, the further gain control means is used to control the power level of the signal to be transmitted if predistortion is not applied to the signal to be transmitted. The first gain control means may, but not necessarily be used to control the power level of the signal to be transmitted if predistortion is not applied to the signal.

Preferably, the transmitter, which may be a radio frequency transmitter described hereinbefore can be included in a mobile station. The mobile station may be arranged to work in a spread spectrum communications system. That spread spectrum communications system may use code division multiple access.

According to a second aspect of the present invention, there is provided a method for controlling a transmitter comprising the steps of receiving a signal to be amplified, causing the signal to be predistorted if the power level of the signal to be transmitted is above a predetermined level, and not predistorting said received signal if the power level of the signal to be transmitted is below a predetermined level, amplifying the predistorted signal and transmitting said signal.

BRIEF DESCRIPTION OF THE DRAWINGS

For a better understanding of the present invention and as to how the same may be carried into effect, reference will now be made by way of example to the accompanying drawings in which:

FIG. 2 shows a schematic view of a transmitter embodying the present invention;

DETAILED DESCRIPTION OF PREFERRED EMBODIMENTS OF THE INVENTION

Figure 1:
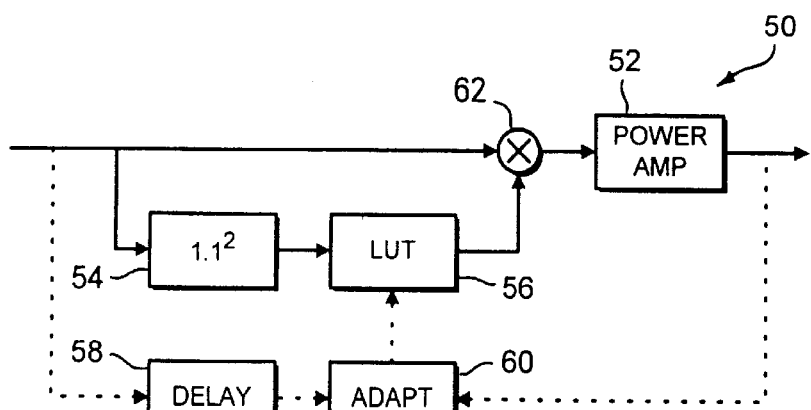
FIG. 1 shows a known transmitter.

Reference will now be made to FIG. 2 which shows a first embodiment of the present invention. In particular, FIG. 2 shows a transmitter for a CDMA mobile station.

FIG. 2 shows a schematic view of a transmitter 61 embodying the present invention. The transmitter 61 has an input 90 which receives the complex signal to be transmitted by the transmitter 61. At this stage, the signal is in digital form and is at a baseband frequency. A complex signal can be regarded as being two signals, one of which is the cosine component and the other of which is the sine component of the complex signal. These components are alternatively referred to as the I and Q components respectively. The signal to be transmitted is input to a first gain control block 92 which receives a control signal 94 from a controller (not shown). The control signal 94 determines the gain applied by the first gain control block 92 to the signal input thereto.

The output of the first gain control block 92 is input to a first switch. The first switch 96 has two positions. In one position, the output of the switch is connected to a digital predistortion circuit 64. When the first switch 96 is in the second position, the output thereof is connected to a bypass path 98 which bypasses the digital predistortion circuit 64. If the signal output by the first switch 96 is input to the predistortion circuit 64, the signal is predistorted. The predistortion applied by the predistortion circuit 64 is opposite to the distortion caused by the non-linearity of a power amplifier module 32 which will be described in more detail hereinafter. Thus when the signal distorted by the predistortion circuit 64 is input to the power amplifier module 32, the output of the power amplifier module has a linear relationship (or as linear as possible) with the digital signal prior to being input to the predistortion circuit 64. The predistortion circuit 64 will be described in more detail hereinafter.

The output of the predistortion circuit 64 is connected to a second switch 100. The other end of the bypass path 98 is also connected to the second switch 100. If the first switch 96 connects its input to the predistortion circuit 64, then the output of the predistortion circuit 64 is connected to the second switch 100. Likewise, if the first switch 96 connects its input to the bypass path 98, then the other end of the bypass path is connected to the second switch 100. The positions of the first and second switches 96 and 100 are controlled by respective control signals 102 and 104 from the controller.

The output of the predistortion circuit 64, which is still in the form of I and Q signals, are input to the digital to analogue (D/A) converter unit 3. The I and Q signals are converted by the digital to analogue convertor unit 3 to analogue I and Q signals. It should be appreciated that the first gain control block 92, the first and second switches 96 and 100, the bypass path 98, the predistortion circuit 64 and the digital to analogue converter unit 3 constitute the digital part of the transmitter 61.

These analogue signals are then filtered by a first lowpass filter unit 4. The first lowpass filter unit 4 filters out undesired components which are introduced by the digital to analogue convertor unit 3. The I and Q signals output by the first lowpass filter unit 4 are mixed in an IQ modulator 5 with a signal from a first local oscillator 7. The combined, modulated, signal output by the modulator 5 is at an intermediate frequency. The combined signal output from the modulator 5 is input to a second gain control block 13 which applies a gain to the signal input thereto in accordance with a control signal 13a from the controller. The output of the second gain control block 13 is input to a first bandpass filter 11 which is tuned to the intermediate frequency. The first bandpass filter 11 filters out any undesired components introduced by the modulator 5 and the second gain control block 13. The output of the first bandpass filter 11 is applied to a multiplier 6 where the modulated signal is mixed with the signal from a second local oscillator 8 to provide an output which represents the signal at the radio frequency, ie the frequency at which the signals are transmitted by the transmitter 61. The output of the multiplier 6 is input to a third gain control block 26 which is arranged to receive a control signal 28 from the controller. The control signal 28 controls the amount of gain applied to the signal input to the third gain control block 26. The output of the third gain control block 26 is input to a second bandpass filter 15 where the signal is filtered to remove any unwanted components introduced by the multiplier 6 or the third gain control block 26. The second bandpass filter 15 is tuned to the radio frequency.

The output of the second bandpass filter 15 is input to a power amplifier module 32 which amplifies the signal. The amplifier module 32 may comprise one amplifier or a plurality of amplifiers in series. The amplified signal amplified by the power amplifier module 32 is output for transmission. A coupler 38 is connected to the output of the power amplifier module 32.

In the embodiment shown in FIG. 2, one output of the coupler 38 is transmitted. A second output of the coupler 38 is connected to a second multiplier 44. The coupler 38 allows a small proportion of the signal to be transmitted to be fed to the second multiplier 44 as a feedback signal. The second multiplier 44 also receives an input from the second local oscillator 8. The output of the second multiplier 44 represents the signal, which is transmitted, but at the intermediate frequency instead of the radio frequency. In other words the second multiplier 44 down converts the signal from the radio frequency to the intermediate frequency.

The output of the second multiplier 44 is input to a fourth gain control block 80 which receives a control signal 83 from the controller. The gain applied to the signal input to the fourth gain control block 80 is determined by the control signal 83. The output of the fourth gain control block 80 is input to an IQ demodulator 82 which also receives an input from the first local oscillator 7. The output of the demodulator 82 is therefore at the baseband frequency and includes an I component and a Q component. The output of the demodulator 82 is connected to a second lowpass filter unit 86 which filters the I and Q signals to remove undesired components introduced by the IQ demodulator 82, the fourth gain control block 83 and the second multiplier 44. The I and Q signals are input to an analogue to digital (A/D) converter unit 84 which converts the I and Q signals to digital form. The I and Q signals output by the analogue to digital converter unit 84 are input to the predistortion circuit 64. The path from the output of the analogue to the digital converter unit 84 to the predistortion circuit 64 is referred to as the adaption path 85.

The predistortion circuit 64 is arranged to compare the signals which are input to the predistortion circuit 64 to be transmitted with the signals which are actually transmitted and which the predistortion circuit 64 has received via the adaption path 85. The predistortion circuit 64 compares these signals which ideally should be the same. Based on the comparison, the predistortion circuit 64 calculates corrected predistortion coefficients which are to be applied to subsequent digital signals to be output from the predistortion circuit 64 so that the transmitted signals and the signals to be transmitted are as similar as possible. If the signal to be transmitted is the same or similar to the transmitted signal (except for the gain) it can be assumed that the predistortion applied by the predistortion circuit 64 has provided good compensation for the non-linearity of the power amplifier module 32.

The non-linearity characteristics of the power amplifier module 32 may change with temperature. Accordingly, the predistortion applied by the predistortion circuit 64 may be continuously modified, taking into account the changes caused by, for example, changes in temperature.

When the transmitted power level is decreased below a given level, the digital predistortion circuit 64 is switched off. The position of the first switch 96 is controlled by the controller to prevent the signal output by the first gain control block 92 from passing through the predistortion circuit 64. Instead the first switch 96 is positioned to direct the output from the first gain control block through the bypass path 98. Likewise, the second switch will be positioned to connect the bypass path 98 to the digital to analogue converter unit 3. As the digital predistortion circuit 64 is switched off, the feedback path consisting of the second multiplier 44, the fourth gain control block 80, the demodulator 82, the second lowpass filter unit 86 and the analogue to digital converter unit 84 provide no useful function and therefore all of these components can be switched off.

If the signal is to be transmitted with a power level which is above the given level, the first switch 96 is controlled to connect the output of the first gain control block 96 to the input of the predistortion circuit 64. The predistortion circuit 64 then predistorts the signal to compensate for the non linearity of the power amplifier module 32. The output of the predistorter circuit 64 is then connected by the second switch 100 to the digital to analogue converter unit 3.

In this embodiment of the invention, the gain provided by the second and/or third gain control block 13 and 26 is controlled in order to achieve smooth power control when changing from the case where the predistortion circuit 64 is used to the case where the predistortion circuit 64 is not used, and vice versa. In one alternative, the first gain control block 92 can be used instead of the second and/or third gain control blocks for this purpose.

At lower power levels, below the given level, the non linearity of the power amplifier module 32 does not cause a significant amount of spectrum spreading to adjacent channels. In other words, the signal in the adjacent channels caused by the spectrum spreading is low due to the low power level. Thus, the power consumed by the predistortion circuit 64 can be saved at lower power levels by switching off that circuit. If spectrum spreading does occur, at the lower power levels, it is unlikely to give rise to significant levels of interference. However, at higher power levels where spectrum spreading to adjacent channels would be a more significant problem, the predistortion circuit 64 can be used.

In preferred embodiments of the invention, only the first gain control block 92 is used if the predistortion circuit 64 is used and not bypassed. The second and third gain control blocks 13 and 26 are set to each provide unitary gain. If the first bypass path is used, then all three of the first, second and third gain control blocks 92, 13 and 26 will be used to control the power of the signal to be transmitted. Alternatively, in some embodiments, the first gain control block will provide constant gain only with the power control being provided by the second and/or third gain control blocks 13 and 26. Fine tuning of the power level, for example with step sizes of 1 dB, can be achieved by the first gain control block 92 or the second and/or third gain control blocks 13 and 26.

The first gain control block 92 is required before the predistortion circuit 64, or otherwise a look up table would be required for each power level in the range in which predistortion is used. This would increase the size of memory required. Another possibility would be to use much faster adaptation time so that the predistorter adapts almost instantly when the power level is changed. This would increase the power consumption, because power consumption of digital circuits, and especially the analogue to digital converters, is proportional to operation speed. In some applications, particularly wideband applications, it may also be that in practice it is impossible to implement adaption fast enough. If a large power control range is required, it is important that the predistortion circuit be bypassed at lower power levels. If this does not occur, the first gain control block 92 would need to provide the entire power control range which can be difficult to implement.

In one modification to this embodiment, look up tables are provided for some of the highest power levels, at which predistortion is provided. For example, if the total dynamic range is 80 dB in 1 dB steps, there could be look up tables for the 9 highest power levels and, at the other power levels predistortion will not be provided. If the look up tables are provided for the nine highest power levels, the first gain control block 92 may be omitted. However, in some embodiments, the first gain control block will be provided with the nine look up tables. It should be appreciated that the FIG. 9 for the number of look up tables is by way of example only.

Figure 3:
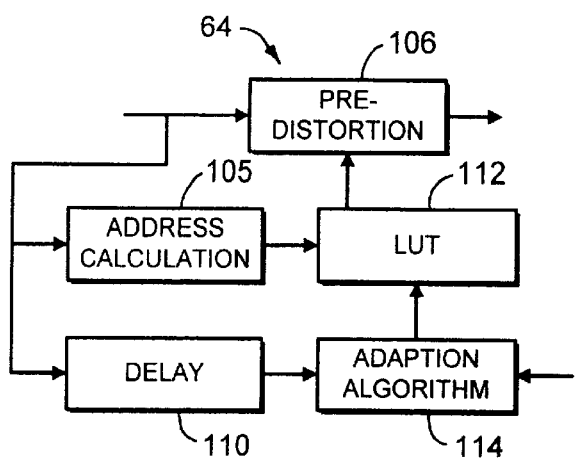
FIG. 3 shows a more detailed view of the predistortion circuit of FIG. 2.

Reference will now be made to FIG. 3 which shows the predistortion circuit 64 of FIG. 2 in more detail. The output of the first gain control block 92 is input to a predistorter 106 as well as to a address calculator 108 and a delay block 110. The address calculator 108 calculates an address from the input signal. This address may be calculated from the magnitude or power of the input I and Q signals received from the first gain control block 92. It should be appreciated that the address calculator 108 can use any suitable method to calculate an address. The address calculated by the address calculator 108 corresponds to a location in a look up table (LUT) 112. Once the address has been calculated, that address is output to the LUT 112 and the value or values at the calculated address are output from the LUT 112 to the predistorter 106. The predistorter 106 then predistorts the I and Q signals from the first gain control block 92 in accordance with the value or values obtained from the LUT 112. For example, the value(s) from the LUT may provide coefficients by which the input I and Q signals are multiplied. The predistorted I and Q signals are then output by the predistorter 106 to the second switch 100.

The input I and Q signals received from the first gain control block 92 are also input to the delay block 110 which may be a shift register or another type of memory which temporarily stores the signals.

The predistortion circuit 64 also includes an adaption algorithm block 114 which is arranged to receive the output of the analogue to digital converter unit 84. The adaption algorithm block 114 compares the signals which are actually transmitted and which are received from the analogue to digital converter unit 84 with the signals which are input to the predistortion circuit 64. The delay block 110 provides the signals which are input to the predistortion circuit 64 to the adaption algorithm block at the same time as the signals which are transmitted are received by the algorithm block 114. In other words, the delay provided by the delay block 110 is equal to the time taken for the signal output by the predistortion circuit 64 to pass through the elements of the transmitter 61 up to the coupler 38 and back to through the feedback path to the adaption algorithm block 114.

The adaption algorithm compares the signals which are transmitted with the signals which are input to the predistortion circuit 64. If the correct predistortion has been applied to the input signals by the predistorter 106, then the signals should have a linear relationship with each other. The comparison carried out by the adaption algorithm block 114 is thus a measure as to how good the predistortion carried out by the predistorter 106 is. Based on this comparison, the adaption algorithm block 114 calculates, if necessary, corrected predistortion value(s) which are output by the adaption algorithm block 114 to the corresponding address in the LUT 112 calculated by the address calculator 108. These values will then be used in a subsequent predistortion. The adaption algorithm block 114 can perform any suitable calculation to obtain the corrected values.

Figure 4:
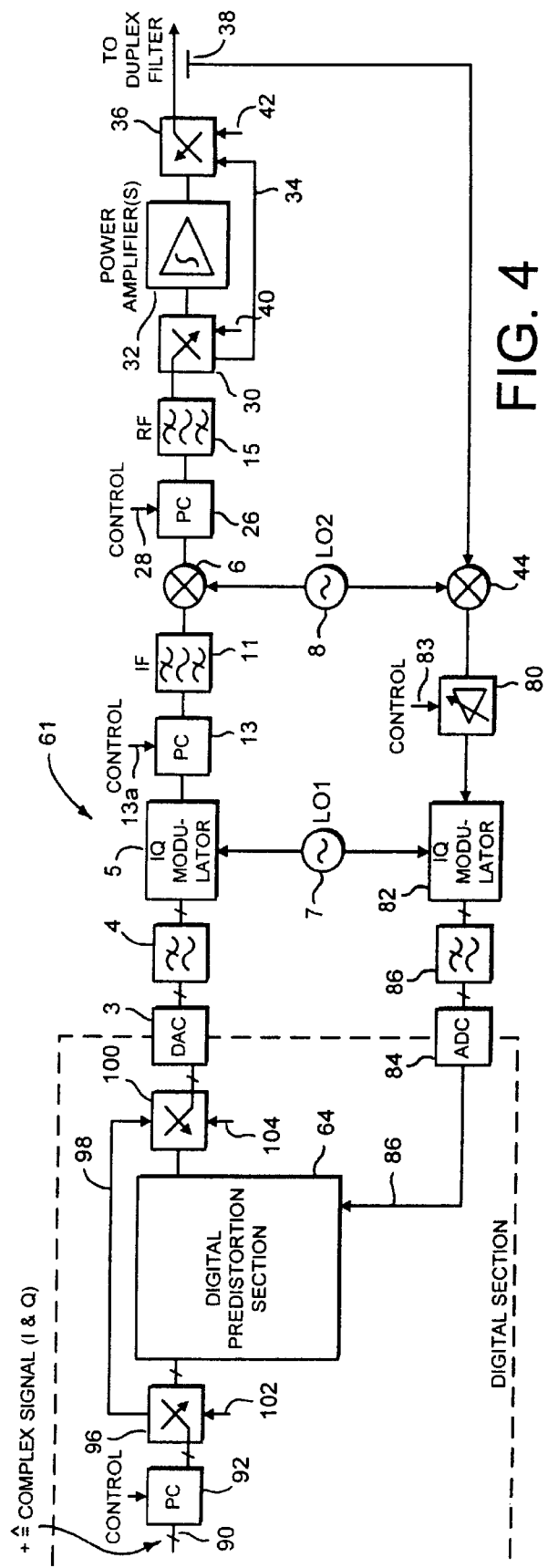
FIG. 4 shows a schematic view of a modification to the transmitter shown in FIG. 2.

A modification to the embodiment shown in FIG. 2 is shown in FIG. 4. The same reference numerals as used in relation to FIG. 2 will also be used in FIG. 4 for the same items. A third switch 30 is provided between the output of the second bandpass filter 15 and the input to the power amplifier module 32. The third switch 30 has two positions. In one position, the output of the second bandpass filter 15 is connected to the input of the power amplifier module 32. In the other position, the output of the second bandpass filter 15 is connected to a second bypass path 34. A fourth switch 36 is provided between the output of the power amplifier module 32 and the coupler 38. When the first switch 30 connects the output of the second bandpass filter 15 to the input of the power amplifier module 32, then the second switch 36 will connect the output of the power amplifier module 32 to the coupler 38. On the other hand, when the output of the second bandpass filter 15 is connected to the second bypass path 34, then the fourth switch 36 connects the other end of the bypass path 34 to the coupler 38.

The bypass path 34 may provide no gain, attenuation or a small degree of amplification, less than that provided by the power amplifier module 32. The positions of the third and fourth switches 30 and 36 are controlled by respective control signals 40 and 42 provided by the controller. Additional dynamic range can be achieved by using the second and/or third gain control blocks 13 and 26 in conjunction with the second bypass path 34.

When the power of the signals to be transmitted by the transmitter 61 exceed a certain level, the signals will pass through the power amplifier module 32, which provides a greater amplification than the second bypass path 34. The predistortion circuit 64 will also be used so that the signals which are to be transmitted pass through the predistortion circuit 64, where the signals are predistorted. The predistorted signals are then passed to the power amplifier module 32 where the signals are amplified and then transmitted. The first to fourth switches 96, 100, 30, and 36 are controlled by the controller to have the appropriate positions to permit the signals to pass through this path.

However, when the signals are to be transmitted with a lower power level, the signals will pass through the second bypass path 34, bypassing the power module 32. The input signals will also bypass the predistortion circuit 64, passing through the first bypass path 98 and then passing through the second bypass path 34. The predistortion circuit 64 and the components on the feedback path can but not necessarily all be switched off.

In one modification, the predistortion circuit is bypassed not only when the second bypass path 34 is used but also when the amplitude of the input signal applied to the power amplifier module 32 is less than a predetermined threshold or when the output of the power amplifier module is below a given level.

Figure 5:
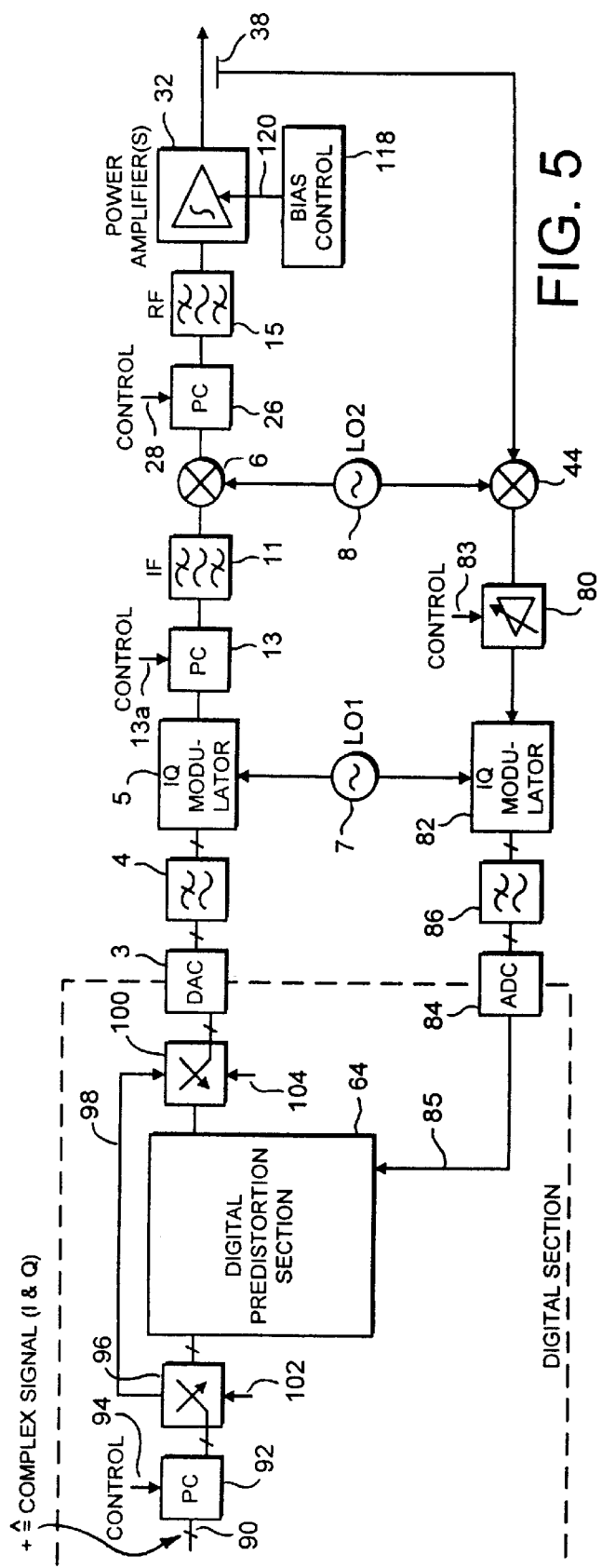
FIG. 5 shows a schematic view of a second modification to the transmitter shown in FIG. 2.

Another modification to the embodiment shown in FIG. 2 is shown in FIG. 5. Those components which are the same as shown in FIG. 2 are referred to by the same reference numbers and will not be described again.

Bias control circuitry 118 controlled by the controller is provided. The output of the bias control circuitry 118 provides a control signal 120 to the power amplifier module 32. The control signal 120 controls the bias voltage applied to the amplifier of the power amplifier module 32. When the power amplifier module 32 comprises more than one amplifier, the control signal 120 may control the bias voltage applied to all of the amplifiers of the module 32 or only some. In one embodiment of the present invention where the power amplifier module comprises a plurality of amplifiers in series, bias control is applied only to the last amplifier in the series as the last amplifier is the most significant in terms of linearity.

The level of the bias voltage applied to an amplifier controls its operating characteristic and in particular determines whether the amplifier operates in a linear or a non linear manner.

When the desired output power level of the signals to be transmitted is below a given level the predistortion circuit 64 will be switched off. When the predistortion circuit 64 is switched off, the bias control circuit 118 changes the bias voltage applied to the amplifier(s). This changes the operating characteristics of the amplifier(s) and for example may make its operation more linear. When the predistortion circuit 64 is on and being used, the bias voltage applied by the bias control circuit 118 causes the amplifier(s) to operate in a more non-linear class which means, in practise, a more power efficient mode of operation. When the predistortion circuit 64 is off, the bias voltage applied by the bias control circuit 94 is such that the amplifier(s) operates in a more linear class. For example, the amplifier(s) may operate as a B class amplifier when predistortion is provided and as an AB class amplifier when no predistortion is provided. This represents a power saving, at lower power levels, as compared to the case where the amplifier(s) operates more efficiently in a non-linear manner but with the predistortion circuit 64 switched on.

In this embodiment, the gain applied by the third gain control block 26 should be carefully controlled in order to ensure that the power of the signal output by the power amplifier module 32 is smooth when making the transition from using one bias voltage to using another bias voltage.

If the bias voltage applied to an amplifier is changed, the gain of the amplifier may be altered. The gain change should be taken into account by, for example, adding a correction value to the current gain of the third gain control block 26. The correction value may be preprogrammed into a memory of the controller. Alternatively, the controller may be arranged so as to learn what correction value is to be applied when the bias voltage is first changed. The correction value may be altered by changes in temperature. In some embodiments of the invention, the correction value applied will depend on the temperature. The controller may be arranged to "learn" how the correction value varies with temperature and thus store a look-up table providing a correlation between the temperature and the correction value.

In the above described embodiments, the predistortion circuit is turned off when it is not used. In alternative embodiments, the first bypass path is not provided. Thus when the required power level of the signal to be transmitted is below a given level, the input signal passes through the predistortion circuit but without any predistortion being applied thereto.

In one alternative to the embodiments described hereinbefore the second and third gain control blocks are replaced by a single gain control block which can be placed in the intermediate frequency part of the circuit or the radio frequency part of the circuit.

It should be pointed out that for clarity only the more relevant components of the transmitter are shown. In practice, there transmitter will include additional components.

Figure 6:
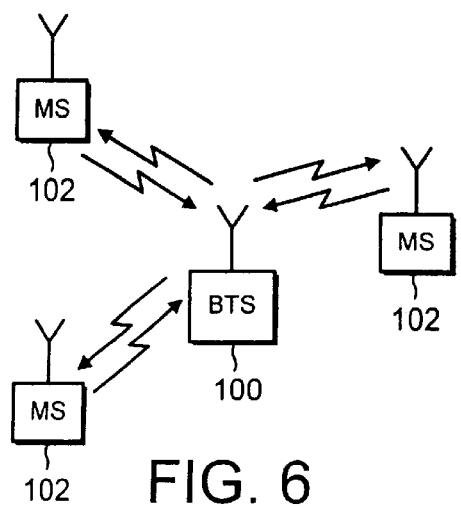
FIG. 6 shows a typical cellular network in which embodiments of the present invention can be used.

FIG. 6 shows part of a cellular communication network in which the transmitter shown in FIGS. 2 to 5 can be used. Cellular telecommunication networks typically comprise a network of base stations 100, one of which is shown in FIG. 7. Each base station 100 is arranged to transmit signals to and receive signals from mobile stations 102. Generally, radio waves are used in the communications between the base stations 100 and the mobile stations 102.

Preferred embodiments of the present invention are incorporated in the mobile stations which are generally battery powered and as such power efficiency is of importance. However, embodiments of the present invention may be incorporated in any suitable radio frequency communication device and may even be incorporated in a base transceiver station. Embodiments of the present invention are particularly suitable for use in spread spectrum communications and, in particular, code division multiple access systems. However, embodiments of the present invention may also be included in other cellular telecommunication networks such as those using frequency division multiple access, time division multiple access and/or space division multiple access as well as hybrids of these systems. Embodiments of the invention are particular applicable to arrangements which require high power control dynamic range and wide bandwidth such as certain CDMA systems.

Embodiments of the invention may be arranged to use direct conversion where the signals are directly converted from the baseband frequency to the radio frequency and not via an intermediate frequency.

What is claimed is:

1. A transmitter comprising:
    amplifier means for amplifying a received signal;
    digital predistortion means for predistorting the received signal prior to the signal passing through said amplifier means;
    transmitting means for transmitting said signal;
    control means for controlling said transmitter, whereby if the power level of the signal to be transmitted by the transmitter means is below a predetermined level, the signal is not predistorted by said digital predistortion means and if the power level of the signal to be transmitted by the transmitter means is above a predetermined level said received signal passes through said digital predistortion means and said amplifier means; and
    digital gain control means for applying a gain to the signal prior to the signal being input to the digital predistortion means;
    whereby said digital control means is used to control the power of the signal to be transmitted.

2. A transmitter as claimed in claim 1, wherein when the power level of the signal is below the predetermined level, the predistortion means is switched off.

3. A transmitter as claimed in claim 2, wherein a bypass path is provided for bypassing said amplifier, whereby if a power level of a signal to be transmitted by the transmitter means is below a given level, a received signal passes through the bypass path.

4. A transmitter as claimed in claim 3, wherein said predistortion means is arranged substantially to compensate for the non-linearity of said amplifier means, when used.

5. A transmitter as claimed in claim 4, wherein bias control means are provided for controlling the biassing applied to said amplifier means, whereby if the power level of the signal to be transmitted by the transmitter means is above the predetermined level, then the amplifier means is controlled by the bias control means to operate in a more power efficient class.

6. A transmitter as claimed in claim 5, wherein when a power level of a signal transmitted by said transmitter is below the predetermined level, the amplifier means is controlled by the bias control means to operate substantially linearly.

7. A transmitter as claimed in claim 1, wherein said amplifier means comprises a plurality of amplifiers arranged in series.

8. A transmitter as claimed in claim 7 wherein said bypass path in one mode of operation allows at least one of said plurality of amplifiers to be bypassed and the received signal is arranged to pass through at least one amplifier, and in another mode of operation, a different number of amplifiers is bypassed.

9. A transmitter as claimed in claim 8, wherein in said another mode of operation all of said amplifiers are bypassed.

10. A transmitter as claimed in claim 8, wherein, in said another mode of operation, no amplifiers are bypassed.

11. A transmitter as claimed in claim 8, wherein said bias control means are arranged to control the biasing of at least one of said amplifiers.

12. A transmitter as claimed in claim 1, wherein a feedback path is provided for providing the predistortion means with a portion of the transmitted signal, said predistortion means being arranged to compare the portion of the transmitted signal with the signal received by the predistortion means.

13. A transmitter as claimed in claim 12, wherein the predistortion means is arranged to calculate at least one new predistortion value to be used by the predistortion means for a subsequent predistortion if the portion of the transmitted signal and the signal input to the predistortion means do not have a predetermined relationship.

14. A transmitter as claimed in claim 13, wherein the predetermined relationship is that the portion of the transmitted signal has a linear relationship with the signal input to the predistortion means.

15. A transmitter as claimed in claim 12, wherein when the predistortion means is not used, the feedback path is switched off.

16. A transmitter as claimed in claim 1, wherein at least one further gain control means is provided between the output of the predistortion means and the amplifier means.

17. A transmitter as claimed in claim 16, wherein the further gain control means is used to control the power level of the signal to be transmitted if predistortion is not applied to the signal to be transmitted.

18. A transmitter as claimed in claim 17, wherein the further gain control means is also used to control the power level of the signal to be transmitted if predistortion is not applied to the signal.

19. A mobile station comprising a transmitter said transmitter comprising:
    amplifier means for amplifying a received signal;
    digital predistortion means for predistorting a received signal prior to the signal passing through said, amplifier means;
    transmitting means for transmitting a signal;
    control means for controlling said transmitter, whereby if the power level of the signal to be transmitted by the transmitter means is below a predetermined level the signal is not predistorted by said digital predistortion means and if the power level of the signal to be transmitted by the transmitter means is above a predetermined level said received signal passes through said digital predistortion means and said amplifier means; and
    digital gain control means for applying a gain to the signal prior to the signal being input to the digital predistortion means;
    whereby said digital control means is used to control the power of the signal to be transmitted.

20. A method for controlling a transmitter comprising the steps of:
    receiving a signal to be amplified;
    controlling the gain of the signal prior to digital predistortion;
    causing the signal to be predistorted if the power level of the signal to be transmitted is above a predetermined level, and not predistorting said received signal if the power level of the signal to be transmitted is below a predetermined level;
    amplifying the predistorted signal and transmitting said signal;

whereby said step of controlling the gain of the signal prior to digital distortion is used to control the power of the signal to be transmitted.

21. A transmitter comprising:

amplifier means for amplifying a received signal;

digital predistortion means for predistorting a received signal prior to the signal passing through said amplifier means;

transmitting means for transmitting a signal;

control means for controlling said transmitter, whereby if the power level of the signal to be transmitted by the transmitter means is below a predetermined level, the signal as not predistorted by said digital predistortion means and if the power level of the signal to be transmitted by the transmitter means is above a predetermined level said received signal passes through said digital predistortion means and said amplifier means;

digital gain control means for applying a gain to the signal prior to the signal being input to the digital predistortion means; and further gain control means for applying a further gain to the signal between the output of the digital predistortion means and the amplifier means;

whereby said digital control means is used to control the power of the signal to be transmitted.

22. A method for controlling a transmitter comprising the steps of:

receiving a signal to be amplified;

controlling the gain of the signal prior to digital predistortion;

causing the signal to be predistorted if the power level of the signal to he transmitted is above a predetermined level, and not predistorting said received signal if the power level of the signal to be transmitted is below a predetermined level;

further controlling the gain of the signal between the digital predistortion means and the amplifier means;

amplifying the predistorted signal; and transmitting said signal;

whereby said step of controlling the gain of the signal prior to digital distortion is used to control the power of the signal to be transmitted.

23. A transmitter comprising:

amplifier means for amplifying a received signal;

predistortion means for predistorting a received signal prior to the signal passing through said amplifier means;

transmitting means for transmitting a signal;

control means for controlling said transmitter, whereby if the power level of the signal to be transmitted by the transmitter means is below a predetermined level, the signal is not predistorted by said predistortion means and if the power level of the signal to be transmitted by the transmitter means is above a predetermined level said received signal passes through said predistortion means and said amplifier means; and a bypass path for bypassing said amplifier, whereby if the power level of a signal to be transmitted by the transmitter means is below a given level, a received signal passes through the bypass path.

24. A method for controlling a transmitter comprising the steps of:

receiving a signal to be amplified;

causing the signal to be predistorted if the power level of the signal to be transmitted is above a predetermined level, and not predistorting said received signal if the power level of the signal to be transmitted is below a predetermined level;

amplifying with an amplifier the predistorted signal if the signal is to be transmitted with a predetermined power level or higher and bypassing the amplifier if the signal is to be transmitted with a power level less than said predetermined level; and transmitting said signal.

25. A transmitter comprising:

amplifier means for amplifying a received signal;

digital predistortion means for predistorting a received signal prior to the signal passing through said amplifier means;

transmitting means for transmitting a signal;

control means for controlling said transmitter, whereby if the power level of the signal to be transmitted by the transmitter means is below a predetermined level, the signal is not predistorted by said digital predistortion means and if the power level of the signal to be transmitted by the transmitter means is above a predetermined level said received signal passes through said digital predistortion means and said amplifier means; and whereby if the power level of the signal to be transmitted by the transmitter means is above the predetermined level, then the amplifier means is controlled by the control means to operate in a more power efficient class.

26. A method for controlling a transmitter comprising the steps of:

receiving a signal to be amplified;

causing the signal to be digitally predistorted if the power level of the signal to be transmitted is above a predetermined level, and not predistorting said received signal if the power level of the signal to be transmitted is below a predetermined level;

amplifying with an amplifier the digitally predistorted signal and if the signal is to be transmitted with a predetermined power level or higher controlling the amplifier to operate in a more power efficient class; and transmitting said signal.

27. A transmitter comprising:

amplifier means for amplifying a received signal;

digital predistortion means for predistorting a received signal prior to the signal passing through said amplifier means;

transmitting means for transmitting a signal;

control means for controlling said transmitter, whereby if the power level of the signal to be transmitted by the transmitter means is below a predetermined level the signal is not predistorted by said digital predistortion means and if the power level of the signal to be transmitted by the transmitter means is above a predetermined level said received signal passes through said digital predistortion means and said amplifier means; and digital gain control means for applying a gain to the signal prior to the signal being input to the digital predistortion means;

wherein said digital gain control means only is used to control the power level of the signal to be transmitted if predistortion is applied to the signal.

* * * * *

UNITED STATES PATENT AND TRADEMARK OFFICE
CERTIFICATE OF CORRECTION

PATENT NO. : 6,591,090 B1
DATED : July 8, 2003
INVENTOR(S) : Vuorio et al.

Page 1 of 1

It is certified that error appears in the above-identified patent and that said Letters Patent is hereby corrected as shown below:

<u>Title page,</u>
Item [12], "Vuorio et al" should be replaces with -- Lilja et al. --
Item [75], Inventors, "Juha Vuorio, Oulo" should be deleted; after "Harri Lilja, Kimmontie (FI)" insert -- Petri Manninen, Oulo (FI); Marko Leinonen, Oulu (FI) --
Item [30], Foreign Application Priority Data, "9811381" should read -- 9811381.4 --

Signed and Sealed this

Twenty-fifth Day of May, 2004

JON W. DUDAS
*Acting Director of the United States Patent and Trademark Office*